US005933190A

United States Patent [19]
Dierickx et al.

[11] Patent Number: 5,933,190
[45] Date of Patent: Aug. 3, 1999

[54] PIXEL STRUCTURE, IMAGE SENSOR USING SUCH PIXEL STRUCTURE AND CORRESPONDING PERIPHERAL CIRCUITRY

[75] Inventors: Bart Dierickx, Mortsel; Nico Ricquier, Heverlee, both of Belgium

[73] Assignee: IMEC vzw, Leuven, Belgium

[21] Appl. No.: 08/635,035

[22] Filed: Apr. 18, 1996

[51] Int. Cl.$^6$ .................................................. H04N 3/14
[52] U.S. Cl. .......................................... 348/302; 348/308
[58] Field of Search .................................... 348/300, 301, 348/302, 308

[56] References Cited

U.S. PATENT DOCUMENTS

| | | | |
|---|---|---|---|
| 5,122,881 | 6/1992 | Nishizawa et al. | 348/301 |
| 5,144,447 | 9/1992 | Akimoto et al. | 348/308 |
| 5,293,240 | 3/1994 | Matsunaga | 348/320 |
| 5,296,696 | 3/1994 | Uno | 348/246 |
| 5,311,319 | 5/1994 | Monoi | 348/301 |
| 5,335,008 | 8/1994 | Hamasaki . | |
| 5,336,879 | 8/1994 | Sauer | 348/308 |
| 5,453,783 | 9/1995 | Weir | 348/302 |
| 5,488,415 | 1/1996 | Uno | 348/300 |
| 5,502,488 | 3/1996 | Nagasaki et al. | 348/308 |

FOREIGN PATENT DOCUMENTS

| | | |
|---|---|---|
| 2132629 | 3/1993 | Canada . |
| 0 548 987 A3 | 6/1993 | European Pat. Off. . |
| WO 93/19489 | 9/1993 | WIPO . |

OTHER PUBLICATIONS

"A Single Chip Sensor & Image Processor for Fingerprint Verification" Anderson, S., et al., IEEE Custom Integrated Circuits Conference, May 12–15, 1991.

"Pixel Structure with Logarithmic Response for Intelligent and Flexible Imager Architectures" Dierickx, N. Ricquier, *Microelectronic Engineering*, vol. 19, No. 1–4, Sep. 1992.

Primary Examiner—Wendy Garber
Attorney, Agent, or Firm—Knobbe, Martens, Olson & Bear, LLP

[57] ABSTRACT

A pixel structure for CMOS imaging applications, the pixel structure including a photosensitive element, a load transistor in series with the photosensitive element, a first reading transistor, coupled to the photosensitive element and to the load transistor, for reading out signals acquired in the photosensitive element and converting the signals to a voltage drop across the load transistor. The gate length of at least the load transistor is increased by at least 10% compared to a gate length of transistors manufactured according to layout rules imposed by a CMOS manufacturing process, thereby increasing the light sensitivity of the pixel structure.

9 Claims, 7 Drawing Sheets

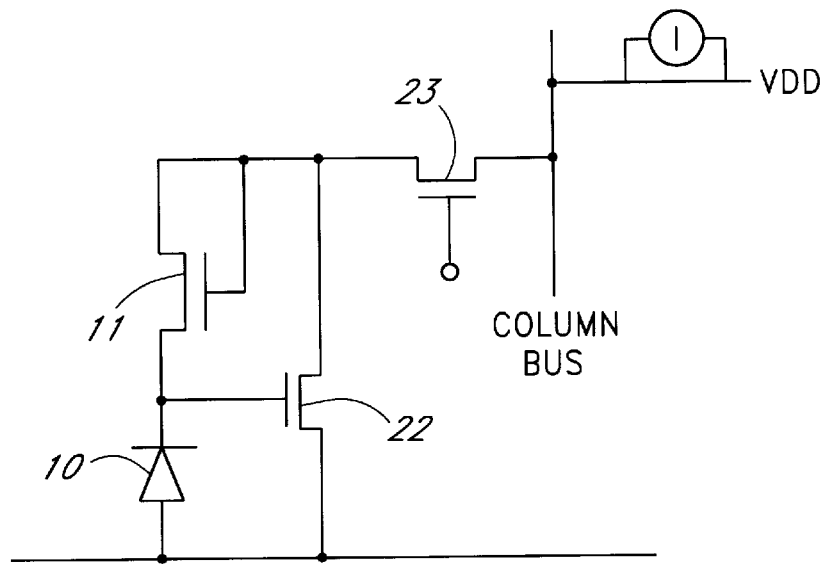
*FIG.4*
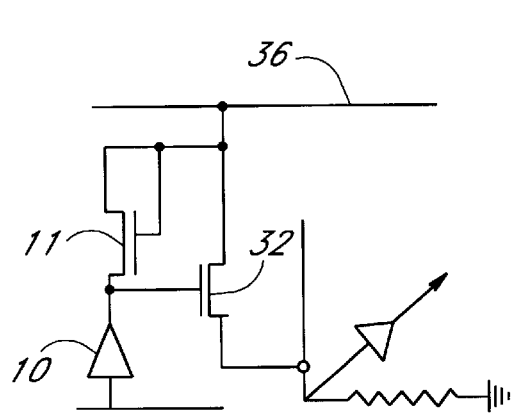      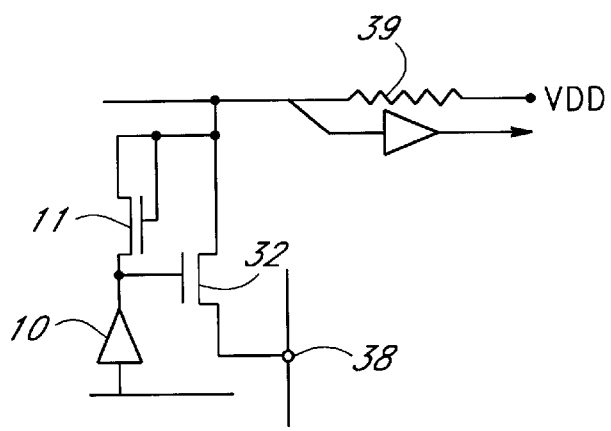
*FIG.5A*              *FIG.5B*

PIXEL STRUCTURE, IMAGE SENSOR USING SUCH PIXEL STRUCTURE AND CORRESPONDING PERIPHERAL CIRCUITRY

FIELD OF THE INVENTION

The present invention relates to a pixel structure for imaging applications, and more particularly, to CMOS image sensors using such pixel structure and their corresponding peripheral circuitry.

BACKGROUND OF THE INVENTION

Charge Coupled Device (CCD) based cameras are commonly used as input devices for image analysis systems. A disadvantage of this class of devices is that when real-time operation is required, only simple calculations can be performed on the CCD output data stream.

A prior art CCD image sensing device is described in U.S. Pat. No. 5,335,008 ('008 patent). The '008 patent is directed to a CCD image sensing device in which an amplifying transistor for amplifying a photoelectrically-converted signal charge and outputting the amplified signal charge to a vertical signal line is provided at every pixel of a plurality of pixels arrayed in a two-dimensional fashion and wherein a load transistor is connected to each of the vertical signal lines, in which the load transistor is composed of a first field effect transistor having a constant current characteristic and a second field effect transistor acting as a negative feedback resistor function connected in series.

In this description, it is the first MOSFET transistor which is reacting as the load of a signal line and serving therefore as the load of a source follower. Accordingly, this transistor has no direct relation with the signal read from the photodiode.

Furthermore, this document describes a CCD image sensing device wherein the first MOSFET transistor has a large ratio W/L wherein W is its channel width and L is its channel length. However, it should be noted that such W/L ratio directly affects the gate voltage ($V_G-V_{th}$) of the MOSFET for a given current. The aim of making this characteristic precise suggests the use of MOSFET transistors as linear resistance elements. The voltage (V)/current (I) relationship for MOSFET transistors is given by the equation $I=\mu_n C_{ox}(W/L)(V_G-V_{TH})V_D$. Accordingly, to achieve linear operation it is necessary to work in the region where "$V_G > V_{th}$."

CMOS based flexible imaging sensors have been developed recently (S. Anderson, IEEE 1991, Custom Integrated Circuits Conference, pp. 12.1.1–12.1.4). Examples of these sensors include the IMPUTER of the VLSI Vision Ltd. company (Scotland) and the MAP2200 product of Integrated Vision Products (Sweden).

A classic image sensor of the integrating type and having a particular source follower circuit is described in European Patent Application No. 92122002.6, entitled "Source Follower Circuit for Image Sensor," Publication No. 0 548 987 ('987 patent). The '987 patent discloses an image sensor in which each pixel in the image sensor comprises one MOSFET of a complex nature such that it includes light sensitive means. In this device, the photo current is accumulated on a capacitance and grows during illumination. At the end of "integration time", it must be reset. The same principle is found in many diode arrays, CCD's devices, MOSFET cameras, etc.

An imaging chip intended for use in a CMOS image sensor with a large number of image pixels with field-effect transistors and a read-out logic is disclosed in PCT Patent No. WO93/19489 (PCT patent). As disclosed in the PCT patent, to map a high input signal dynamic ratio onto a reduced output signal dynamic ratio, each image pixel is connected to one electrode of a first MOS transistor and to the gate of a second MOS transistor while the other electrode of the first MOS transistor is connected to one pole of a voltage source.

An image array of 256 by 256 pixels developed in a 2.4 micron CMOS technology is disclosed in Microelectronics Engineering, Vol. 19 (1992) pp. 631–634 (ME Vol. 19). ME Vol. 19 discloses an image array which acts as an asynchronous component having as control signals of one pixel, two 8 bit input words forming the address of said pixel and one analog output. This device is fully addressable which implies that the pixels can be read out in a true random sequence. Furthermore, the pixels can be read out instantaneously, which is a consequence of the fact that in this device architecture the detected photocurrent is continuously converted to a low impedance voltage signal within the pixel. A general view of the device architecture of the present invention will be described in detail below and more particularly, in connection with FIGS. 1 and 2.

The device described in ME Vol. 19 may function as a compact, low cost smart vision sensor, e.g. for industrial imaging purposes. The device concept allows co-integration with digital logic, in order to build smart vision cameras. The logarithmic response causes this sensor to respond to a broad range of illumination conditions, with nearly perfect anti-blooming performance.

The combination of addressability and continuous, asynchronous readout characteristics allows the read out of the response of any pixel at any time. Both characteristics are intimately linked, adaptations in device architecture to improve one of these two characteristics has a direct beneficial effect on the other characteristic. By using the above described technology, one can achieve a sensor having improved addressability characteristics or continuous readout characteristics.

The CMOS image sensors as disclosed in the above-mentioned references have shortcomings in applications such as industrial imaging. The main disadvantage of the circuits as described in the prior art is that the quality of the image is inferior to CCD system of the present invention. The light sensitivity of prior art imaging devices is limited by constraints inherently linked with the implementation of CMOS technology in their circuits. Also, in prior art device architectures, an absolute measure of the light intensity cannot be provided. Further, a brightness control of the image cannot be achieved by state-of-the-art techniques implemented in CCD's or imaging devices based on integrating techniques of the prior art.

Additionally, in prior art imaging devices, the homogeneity of the image is inherently degraded by the statistical spread on the individual pixel characteristics. Defective "white pixels" can degrade the image homogeneity as well. A further disadvantage of the prior art imaging devices is that all such sensors have only black and white contrast and, accordingly, no color sensitivity.

SUMMARY OF THE INVENTION

The aim of the present invention is to disclose new devices that overcome the drawbacks of the devices and circuits disclosed in the prior art.

The present invention relates to a pixel structure for CMOS image sensors having a photosensitive element, a load transistor in series with the photosensitive element and means, comprising at least another transistor, coupled to the photosensitive element and the load transistor for reading out the signals acquired in the photosensitive element and converting it to a voltage drop across the load transistor. The present invention is essentially characterized by the fact that the gate length of at least the load transistor is increased by at least 10% compared to the gate length of transistors manufactured according to the layout rules imposed by the CMOS manufacturing process.

In one embodiment, such structure can be realized in one individual pixel, and in such case, a CMOS image sensor will be achieved with a geometric configuration of a matrix (j×k) of pixels, each pixel having a photodiode, a load transistor and read-out means.

In a further embodiment, each pixel of the CMOS image sensor has at least one photodiode and a load transistor of which the drain is not tied to a voltage supplier and wherein the read-out means comprise at least a second transistor and a third transistor which is directly connected to the data read-out line.

In another embodiment, each pixel of the CMOS image sensor has only one photodiode and two transistors. One of these transistors being a load transistor and the other transistor being a "reading" transistor connected to a data read-out line thereby allowing each pixel to be read-out in both X - Y and Y - X modes.

In a further embodiment, one pixel comprises only a photodiode and a switch since the load transistor and the read-out means are common for several pixels.

The above and other objects, features, and advantages of the present invention will become apparent to those of ordinary skill in the art upon reading the following detailed description in conjunction with the drawings wherein like parts have like reference numerals throughout.

BRIEF DESCRIPTION OF THE DRAWINGS

FIGS. 4 and 5 represent two other embodiments of the pixel structure for a CMOS sensor according to the present invention.

DETAILED DESCRIPTION OF THE PREFERRED EMBODIMENT

Figure 1:
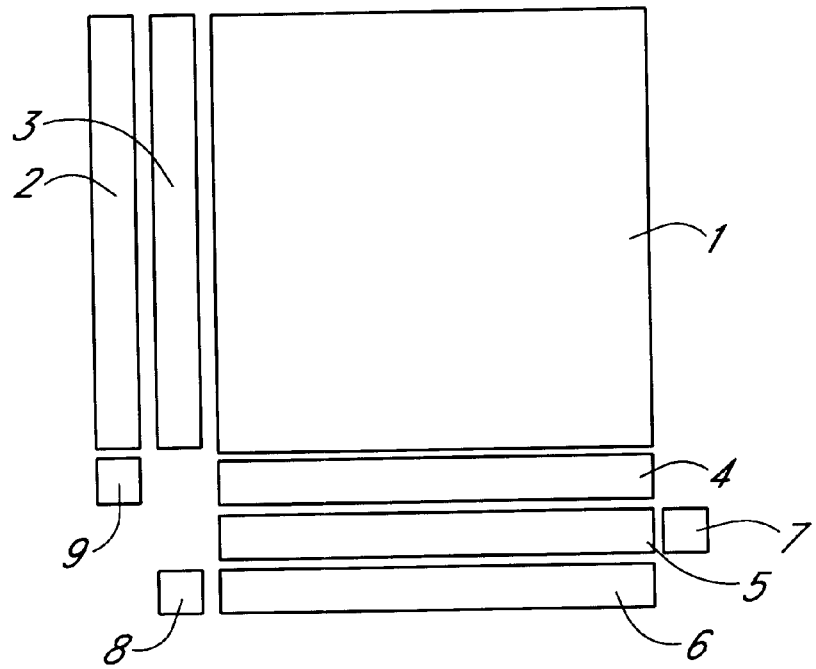
FIG. 1 is a schematic view of the architecture of a CMOS image sensor according to the prior art.

A block diagram of a CMOS image sensor is shown in FIG. 1, wherein Block 1 represents one pixel array surrounded by dummy pixels, Block 2 represents row selection circuits, Block 3 represents buffers, Block 4 represents load transistors for the readout lines, Block 5 represents emitter follower transistors and multiplexers for the output voltages, Block 6 represents column selection circuits, Block 7 represents the output structure, and Blocks 8 & 9 represent address input buffers. In operation, a row selection circuit 3 selects one row of the array 1, putting the corresponding signals on vertical readout lines. The column selection circuit 6 selects one of the emitter followers 5, to transmit a signal of one pixel to the output.

In the following discussion, for the purpose of illustrating the present invention, an implementation of the imaging sensor as a 512×512 active pixel CMOS imager is described. However, is should be understood that this particular embodiment does not limit the scope of the present invention as set forth in the claims. Each pixel in the 512×512 pixel array contains one photodiode and 3 MOSFET transistors, and has a pitch of 6.6 micrometers using a 0.5 micrometer CMOS technology.

The total number of transistors in the CMOS imaging sensor of the present embodiment is approximately 808,000. The fill factor can be only 15%. The small photosensitive area of these types of pixels (compared to the integrating type of imagers) does not degrade speed performance. The nominal supply voltage is 3.3 V, but it appears to work with no degradation between 1.7 V and 5 V.

Figure 2:
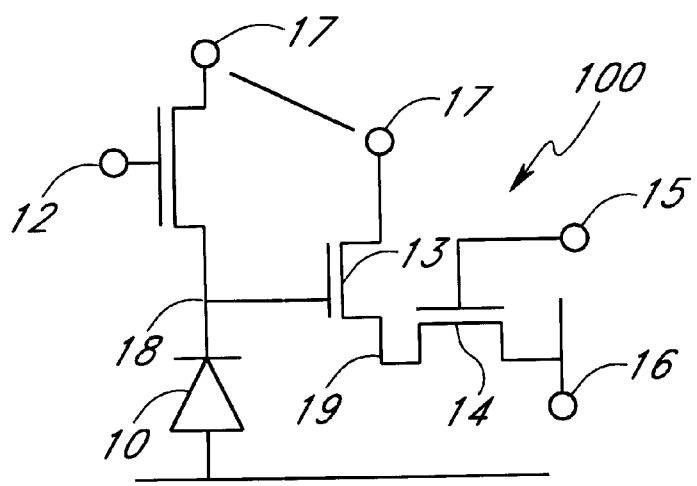
FIG. 2 is a schematic representation of the pixel structure as described in the prior art and used in the sensor shown in FIG. 1.

FIG. 2 gives a schematic representation of the structure of a pixel 100 used in the device shown in FIG. 1. When light is shone on photodiode 10 it is converted into a photodiode current which then flows through a load transistor 11. This current is in the order of femtoamperes to nanoamperes. Thus, the load transistor 11 operates in weak inversion, also called sub-threshold mode ($V_G \ll V_{th}$) and as a consequence, the photocurrent to voltage transition is logarithmically dependent on the current. The source voltage 12 of the load transistor 11 is buffered by an emitter follower transistor 13. A selection transistor 14 of the pixel is connected to an activating line 15 and a data readout line 16.

Thus, the prior art discloses a fully addressable pixel matrix 1 with direct current sensing pixels 100 as shown in FIG. 2, the pixels having a logarithmic V/I response.

It is an object of the present invention to provide a new pixel structure and a CMOS image sensor having improved light sensitivity. This means improved quality of the light/voltage conversion. The sensitivity of prior art pixels, at low light intensities, may be limited by the leakage current through the load transistor 11.

The present invention overcomes this limitation by increasing, by at least 10%, the gate length of transistors and more particularly the load transistor 11, compared to the gate length of transistors manufactured according to the layout rules of a CMOS manufacturing process. The gate length of the transistors such as the load transistor 11 is usually dictated by the requirements of the minimum area occupation and is imposed by the layout rules used for a specific CMOS manufacturing process advised by the silicon foundry. Such CMOS manufacturing process can be a 0.7

μm, 0.6 μm, 0.5 μm, 0.25 μm, 0.18 μm manufacturing process, or any other conventional manufacturing process known by one of ordinary skill in the art.

A specific CMOS manufacturing process is defined by specific rules according to what type of device is to be fabricated. These rules comprise prescriptions for the implementation of successive layers wherein thickness of oxides, diffusion time, and other characteristics known by one of ordinary skill in the art are precisely followed.

An important and more cited characteristic is also the characteristic defining the minimum dimension of the gate length of the transistors manufactured by such process. For instance, in a 0.5 μm CMOS manufacturing process, the transistors are designed with a gate length of 0.5 μm. This characteristic is therefore referred to in the sequel as the layout rules imposed by a specific CMOS manufacturing process. Therefore, if transistors (such as transistors 13 & 14 of FIG. 2) have a gate length of 0.5 μm, this means that they are fabricated by the 0.5 CMOS manufacturing process.

In accordance with the present invention, the load transistor 11 should show a gate length of at least 0.55 μm. As a result of this characteristic, the load transistor 11 will saturate at lower current densities. Therefore, an increased sensitivity of the pixel for lower light intensities (current densities) is achieved. By increasing the gate length, a geometrical separation of source and drain regions is obtained, and the leakage current decreases. An increase of the sensitivity by a factor of 10 to 100 is realized.

Figure 3:
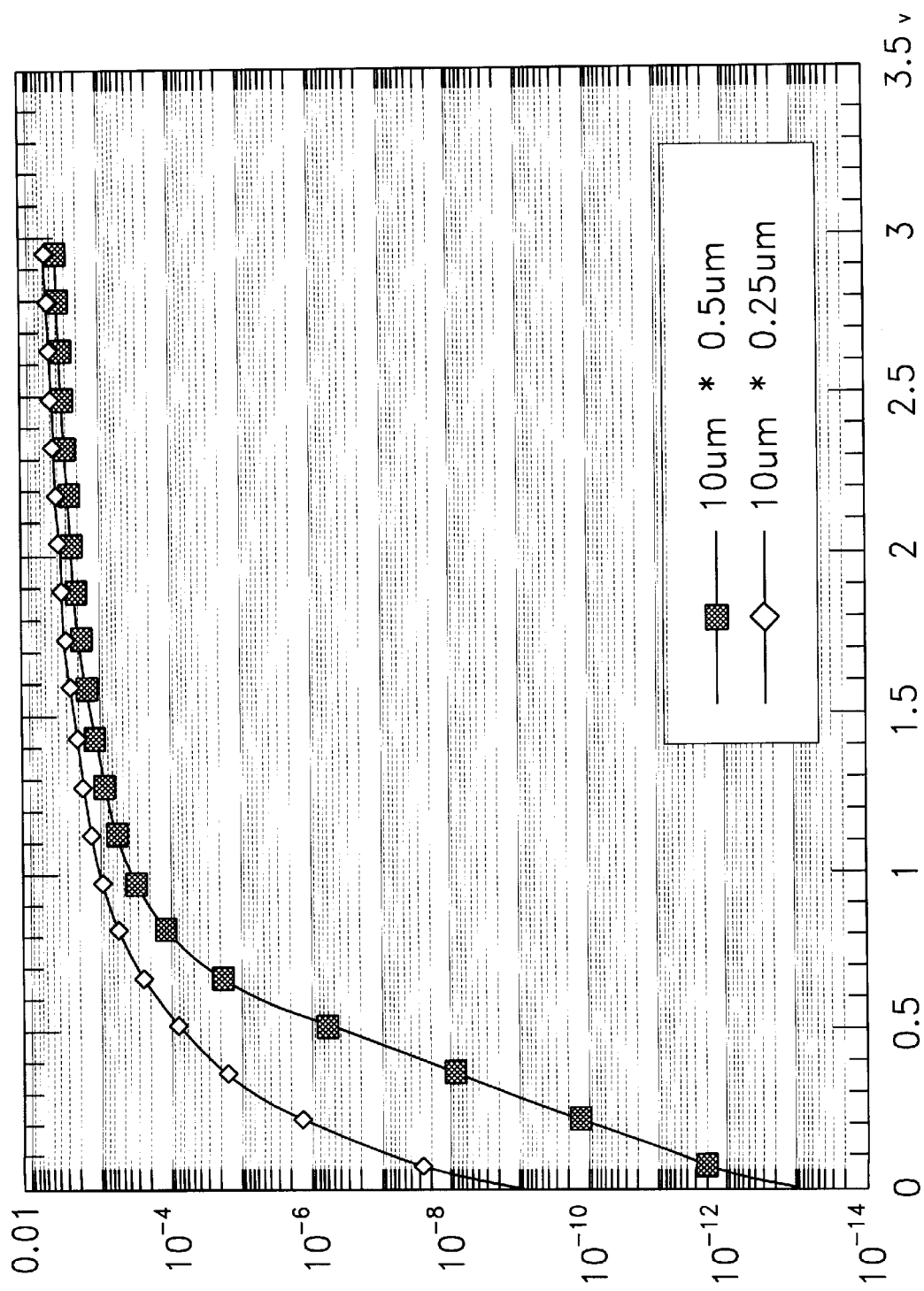
FIG. 3 is a measured graph representing the logarithmic value of the current through a MOSFET transistor (log(I)) versus the voltage (V) for two precise embodiments of a pixel structure wherein the gate length is [10 $\mu$m×0.25 $\mu$m] and [10 $\mu$m×0.5 $\mu$m] respectively.

FIG. 3 represents two examples of measurements done for two pixel structures as represented in FIG. 2, wherein the value [W×L] is [10×0.25 μm] and [10×0.5 ]μm respectively. Accordingly, in this figure wherein an increase of the gate length of 100% is represented, one can observe the sensitivity is increased by a factor of at least 4 decades.

FIG. 4 shows another embodiment of a pixel structure according to the present invention which also shows a logarithmic response. This pixel has the main characteristics of the present invention and includes a photodiode 10, a load transistor 11 in series with the photodiode as well as read-out means 22 and 23.

However, in this case, the drain of the load transistor 11 is not directly tied to the output signal supply. The read-out means consists of a second MOSFET 22 which is not a source follower and finally, a third MOSFET 23 which acts as a switch. A current source 24 provides a current with a magnitude in the order of microamperes. The gate of the transistor 23 is tied to the address.

While the photodiode 10 can also be considered a current source (of the order of femtoamperes to nanoamperes according to the intensity of light impinging the photodiode) the transistor 23 is conducting the current discharging through the transistor 22. Such current can be defined by:

$$I_2 \sim c(V_G - V_{th})$$

wherein c is a constant value.

As $I_2$ is given by the current source and is more or less a constant, we have then $V_G$ also nearly a constant. Therefore, the light acquired by the photodiode 10 is converted into a voltage drop across the load transistor 11. Accordingly, this pixel has the equivalent functions as the one described in FIG. 2. Alternatively, this pixel can also be considered as a simple and classic resistive feedback amplifier.

FIGS. 5a and 5b describe a pixel structure for a CMOS sensor using only two MOSFETs 11 and 32 which can be read out in both X - Y (FIG. 5a) and Y - X modes (FIG. 5b). Since this array has X - Y interchangeability, one can choose to have high-speed addressing in either the X - or Y - directions which can be relevant for particular applications.

According to the X - Y mode described in FIG. 5a, one can apply high voltage to the row to be addressed 36 while low voltage is applied to the load column bus 37 connected to ground. According to the Y - X mode represented in FIG. 5b, one can apply low voltage to the column to be addressed 38 and high voltage to the load row bus 39 connected to the VDD supply.

Figure 6:
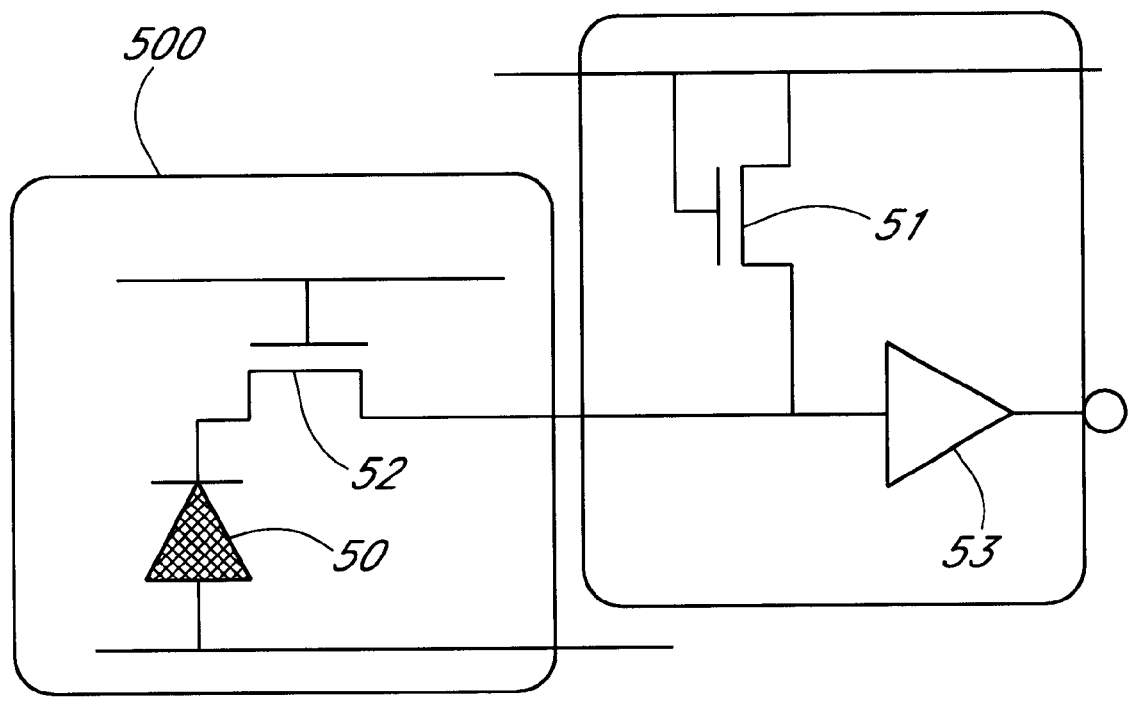
FIG. 6 represents another embodiment of a configuration of pixels for a CMOS sensor according to the present invention.

Using the same imaging area, one can increase the optical resolution using the pixel structure as shown in FIG. 6. As shown in FIG. 6, one pixel comprises only a photodiode 50 and a switch 52 while the load transistor 51 and the read-out means 53 are common to one unit of pixels 500, a unit being e.g. a column or a row of pixels.

It is a further object of the present invention to provide an electronic circuit by which an absolute measurement of the light intensity is realized. Therefore, a pseudopixel (not shown) which does not have an imaging function is integrated in the imager of FIG. 1. In said pseudopixel, the photodiode 10 is replaced by current sources integrated in the chip according to techniques known by those skilled in the art. A known current density is generated by said current sources. The output voltage of said pseudopixel is compared to the output voltage of pixels containing a photodiode. To determine the absolute light intensity on these pixels, which is proportional to the photocurrent, an independent calibration is performed to determine the proportional coefficient between the light intensity and the photocurrent.

Figure 7:
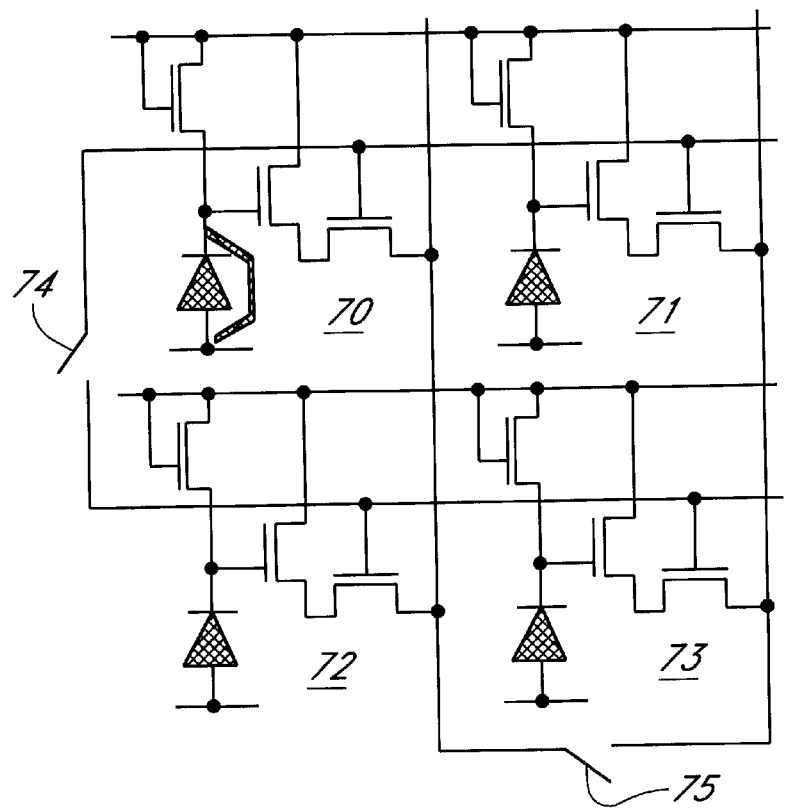
FIG. 7 represents one implementation for a group of 2×2 pixels according to another embodiment of the present invention.

It is a further object of the present invention to provide an electronic circuit wherein certain error signals, known as so-called "white pixels" are corrected by an averaging or minimization operation on a group of pixels in the same area. An implementation is shown in FIG. 7. A group of 4 pixels 70, 71, 72 and 73 is treated as one group for signal processing. According to the implementation shown, a kind of minimum or average value or minimized value of the 4 pixels will be used for further processing. If one of the pixels, e.g., pixel 70, has a defective (leaking) photodiode, during the addressing of the pixel, switches 74 and 75 will be closed and the output signal of pixel 70 will be replaced by an appropriate average value of the pixels 71, 72 and 73. It is evident that any other implementation of such correction method can be imagined. Any (m×n) group of pixels within the pixel matrix will lead to the same result if some kind of averaging or minimization operation is performed and if the extreme values which arise from defective pixel(s) are disregarded.

Figure 8:
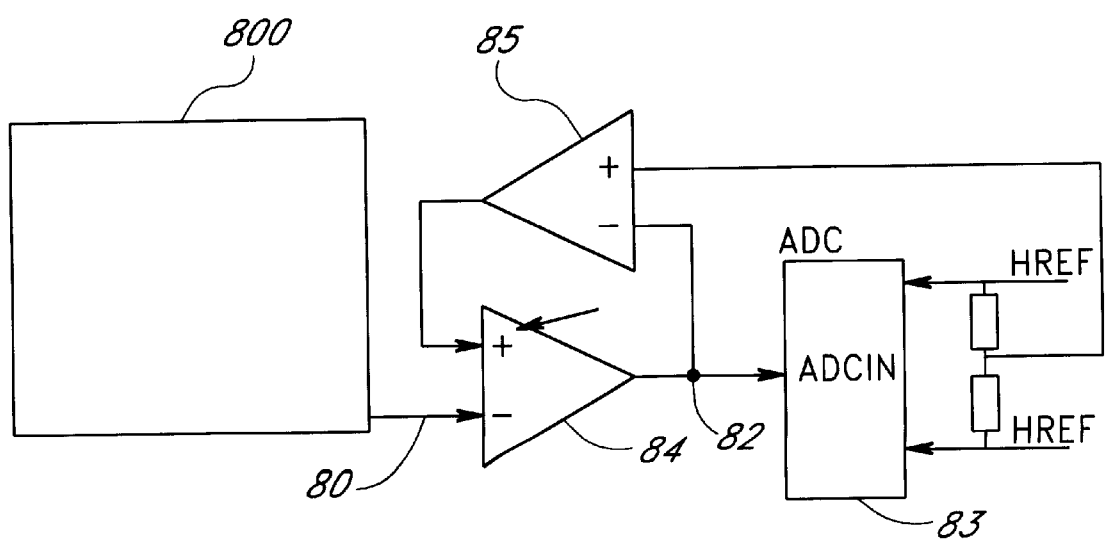
FIG. 8 represents a schematic view of a peripheral circuit controlling the brightness for an image sensor according to the present invention.

It is a further object of the invention to provide an electronic circuit with a built-in automatic control of the brightness of the image. FIG. 8 represents a sensor, according to the present invention, wherein the output voltage 80 of the pixel matrix 800 receives an offset correction before it is applied as an input voltage 82 to a signal processing unit, e.g. an Analog-to-Digital-Converter (ADC) 83. Hence, the output voltage 80 can be brought within the required range of input voltages of the ADC 83. By means of a control circuit 84 with a lowpass filter transfer function 85, the output voltage 80 is increased or decreased until the input voltage 82 at the ADC 83 is within the selected range of the ADC 83. The correction on the output voltage 80 is given by a circuit 85 which yields a slowly varying voltage. This correction circuit acts as an automatic brightness regulating instance for the sensor 81.

Figure 9:
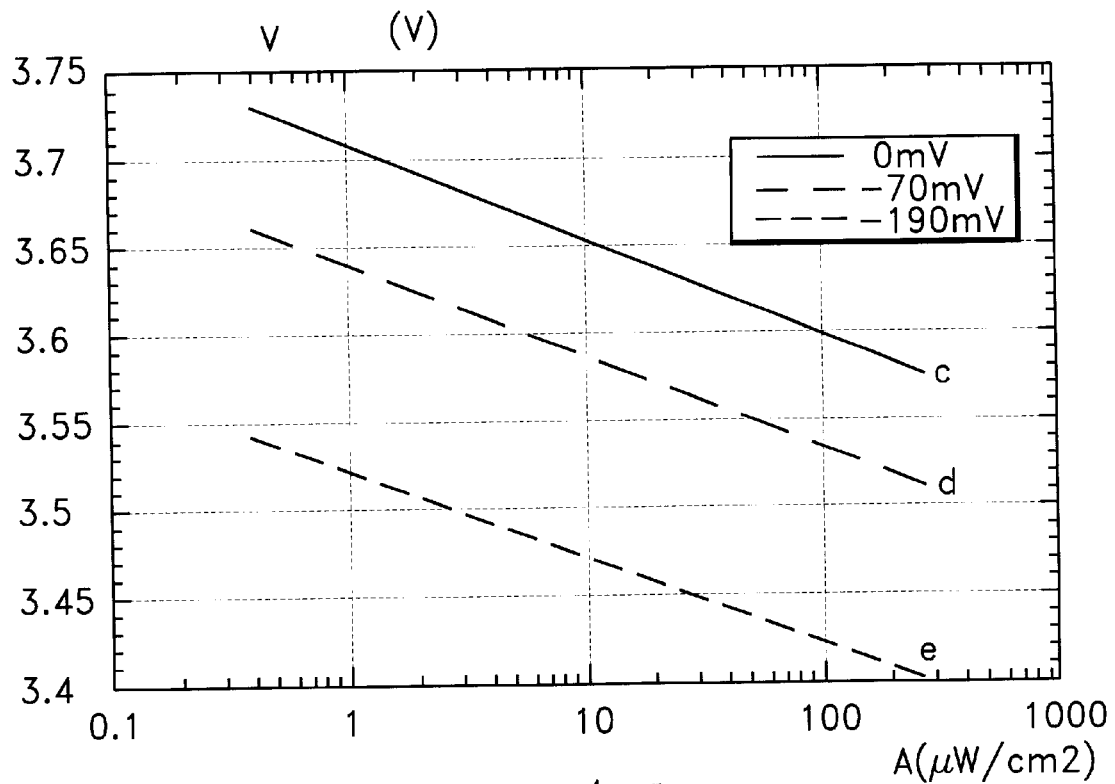
FIG. 9 represents the responses of the light intensity (A) versus the sensor output voltage (V) for different stress conditions.

It is a further object of the present invention to provide an on-chip electronic circuit in which a non-uniformity correction is realized. Non-uniformities in the read-out characteristics of the different pixels arise from the statistical spread on the threshold voltage ($V_{th}$) of the transistors 11–14 and photodiode 10 in the matrix. For each pixel, the actual non-uniformity is the sum of three $V_{th}$ distributions. The situation is especially unfavorable in the case when these transistors have submicron effective sizes which enhance the geometry dependent non-uniformity. For an acceptable image quality, the output signal must be offset corrected pixel by pixel, e.g. by using an external frame memory or by software. This jeopardizes the possibility of a self-contained single-chip smart vision camera. The solution to this problem is to correct the offset internally, in the pixel itself, without increasing the size of the pixel or sensor, and without needing any external memory or software overhead. The hot carrier degradation of MOS transistors which is normally considered as a detrimental effect in semiconductor devices is advantageously used. Degradation experiments indicate that as $V_G$ approaches threshold voltage $V_{TH}$ levels, some transistor parameters are affected while other transistor parameters such as the transconductance remain quite stable. This characteristic is used as a method to realize a homogeneous response for all the pixels as represented in FIG. 2. A high current density is loaded on, e.g., the source follower transistor 13, by applying significantly different voltages at nodes 16 and 17 and an appropriate voltage on 12. Taking programming voltages of 16V at 17, 9V at 12, 6V at 15, and 0V at 16, voltage shifts of 200 mV are realized in about 10 minutes. FIG. 9 illustrates that the stress operation can be performed without flattening the logarithmic response curve. The relaxation effect that occurs after the stress operation makes it necessary to stress the pixel in consecutive iterations. In this way the non-uniformity of the response is reduced to the level of the temporal noise (<5 mV p/p). As a result the pixel's threshold voltage will shift or degrade to a predetermined value. By repeating the operation for different pixels at different times, a pixel matrix with uniform response characteristics is obtained. One can also realize an analog non-volatile memory using this technique.

An imaging sensor as described above can be used as an intelligent imager. Such imager can be achieved as an "imaging system on a chip" and is intended to be interfaced to the outside world without additional external circuitry or post processing.

Figure 10:
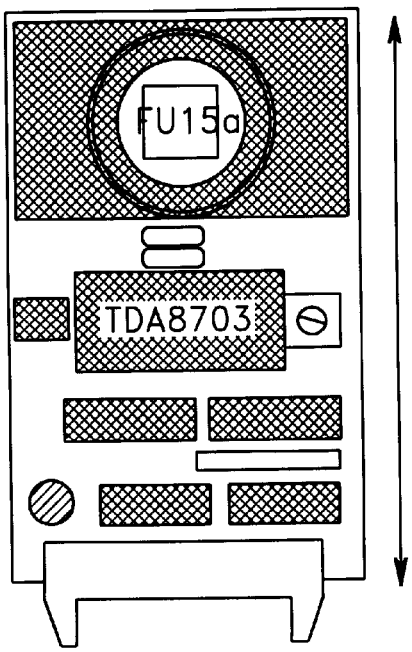
FIG. 10 represents a camera using the electronic image sensor according to the present invention.

FIG. 10 illustrates an application of this image sensor, its integration within a camera module, the "Fuga 15a" smart camera.

An addressable imager with logarithmic response behaves like a 256 Kbyte ROM : after applying an X - Y address (x - y position in matrix), the pixel intensity is returned. The following features are integrated:

total die size: 3.5×3.5 mm$^2$, layer of dummy pixels around the active matrix, pixels have a continuous operation in time (non-integrating), logarithmic intensity to voltage conversion, extra column with reference current sources for calibration of the pixel photocurrents, output load 20 pF, addressing speed 4 Mhz (X), up to 500 kHz (Y), supply 3.0 . . . 3.3 V (operates also from 1.7 to 5 V—but behavior and lifetime not documented).

It is another object of the present invention to provide a CMOS image sensor having a color sensitivity. Therefore, a color mosaic filter is prepared and deposited on the pixel structure of the CMOS image sensor according to the present invention.

Such color mosaic filter preferably has the same structure as the pixel array structure of the CMOS image sensor. In order to achieve this structure, a mask set is used suited for the definition of the pixel structure of the CMOS image sensor and for preparing and depositing the color mosaic filter on the CMOS image sensor.

The process of preparing this color mosaic filter comprises at least the following steps:

(1) preparing a color mixture in the form of a suspension, dispersion or solution containing at least polyvinyl alcohol, dichromat and the required pigment or dye;

(2) spinning this color preparation on the pixel structure of the CMOS image sensor;

(3) illuminating using a mask set suited for the pixel structure of the CMOS image sensor; and (4) etching the illuminated part including rinsing and/or flashing steps. The whole process above may be repeated for depositing further colors. In the above described embodiment, the dichromat may be used as a photosensitive agent or, alternatively, a photoresist my be used.

A preferred embodiment according to the above process is as follows:

(1) preparing a color mixture comprising 10 ml dye and 7 ml dichromat (0.35 g dichromat in 10 ml H$_2$O);

(2) spinning at 3,000 rpm up to a thickness of 1.0–1.5 μm;

(3) illuminating for a time period of 50 sec.;

(4) etching by rinsing with deionized water; and (5) 30 sec. oxygen plasma flashing (150 Watts).

Figure 11:
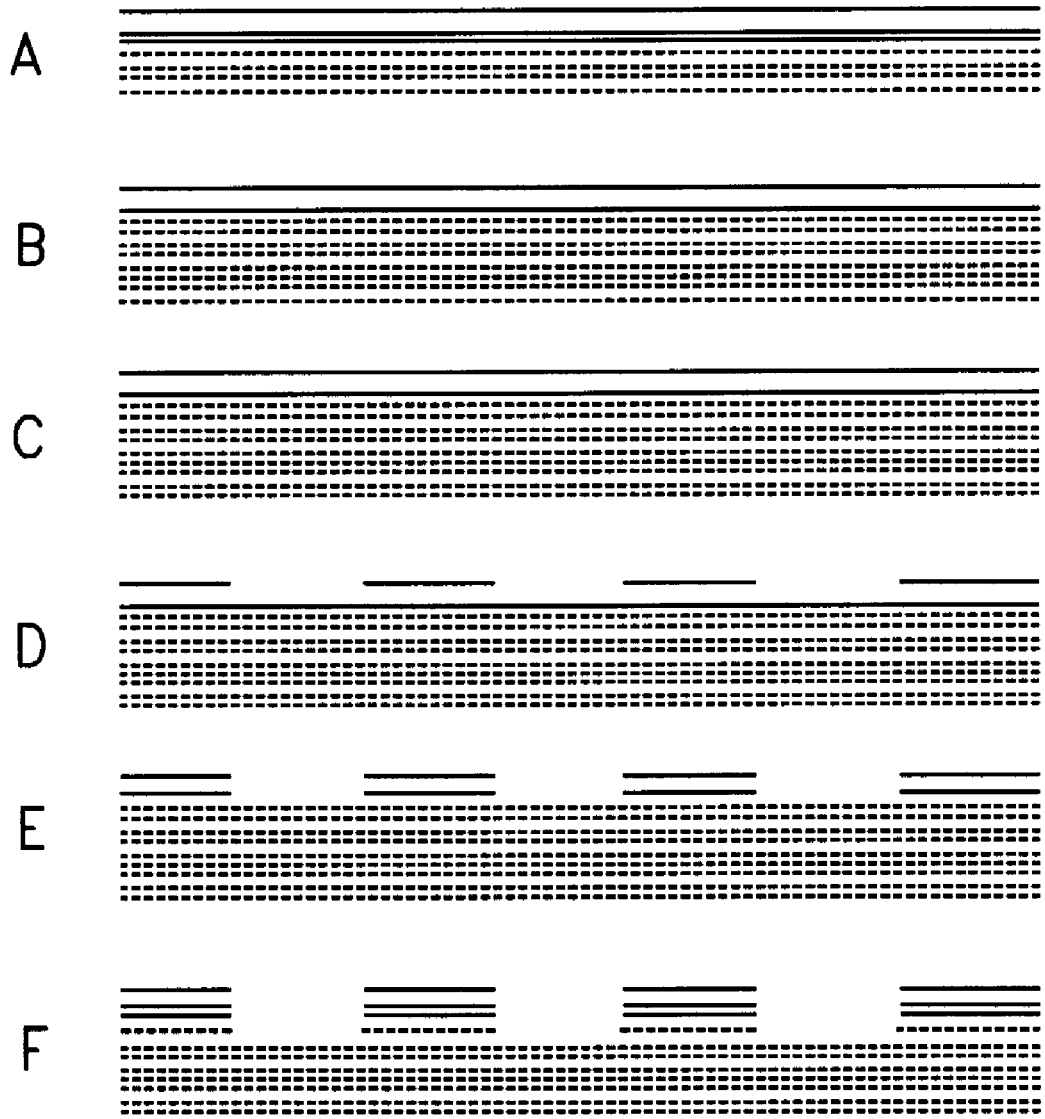
FIG. 11 represents a flow sheet for the fabrication method of a color filter which will be laid on an image sensor according to the present invention.

FIG. 11 describes a functional embodiment of a method of fabrication of such color filter comprising the following steps:

1st color layer:

1st color mixture (blue) obtained as described hereabove spinning at 4000 t/min (step a)

illumination without any mask during 50 sec

Spin on Glass (SOG) 314:

spinning at 2500 t/min (step b)

baking at 130° C. for 20 hrs

Photo-lake XI500EL deposition:

spinning at 4300 t/min (step c)

pre-baked at 100° C. for 15 min illumination with mask—18 sec developing 351—1'10" (step d)

full-baking at 110° C. for 15 min

Etching SOG:

CF$_{4: 100}$ sccm

Ar: 10 sccm

150 Watt—240 sec (step e)

Etching the 1st color layer+deposition of a resist:

02:10 sccm

150 Watt—10 min (step f)

The above steps may be repeated to deposit her colors.

What is claimed is:

1. A pixel structure for use in an image sensor manufactured in CMOS technology in accordance with layout rules defined for a specific CMOS manufacturing process, the pixel structure comprising:

a photosensitive element;

a load transistor in series with the photosensitive element, the load transistor having a gate;

means comprising at least another transistor, coupled to said photosensitive element and said load transistor, for reading out signals acquired in said photosensitive element and converted to a voltage drop across said load transistor, wherein at least the gate of the load transistor has a length which is at least 10% larger than a gate length of transistors including at least said another transistor, manufactured according to the layout rules of the specific CMOS manufacturing process, thereby increasing the light sensitivity of said pixel structure.

2. A CMOS image sensor having a geometric configuration of pixels consisting of a structure as claimed in claim 1, each pixel having at least one photodiode and a load transistor having its gate tied to a voltage and wherein the read-out means comprise at least a second transistor which is an emitter-follower connected to a data read-out line.

3. A CMOS image sensor having a geometric configuration of pixels consisting of a structure as claimed in claim 1, each pixel having at least one photodiode and a load transistor having a drain which is not tied to a voltage and wherein the read-out means comprise a second transistor and a third transistor which functions as a switch and is connected to a data read-out line.

4. A CMOS image sensor having a geometric configuration of pixels consisting of a structure as claimed in claim 1, each pixel having at least one photodiode and a load transistor and read-out means comprising only another transistor, said pixel being read-out in both X - Y, and Y - X modes.

5. A CMOS image sensor having a geometric configuration of pixels comprising a structure as claimed in claim 1 characterized in that each pixel includes only a photodiode and a switch, the load transistor and the readout means being common for one unit of several individual pixels.

6. A CMOS image sensor as claimed in claim 1 further comprising at least one pseudopixel comprising a current source instead of a photodiode, in order to determine the absolute light intensity of the pixels.

7. A CMOS image sensor as claimed in claim 1 further comprising defined groups of (n×m) pixels yielding one output voltage signal, said output voltage signal being an average or minimized value of the individual output voltage signals of non-defective pixels in one group.

8. A CMOS image sensor as claimed in claim 1 further comprising a mosaic color filter which has preferably the structure of the pixel array.

9. A method for increasing light sensitivity of a pixel structure for use in an image sensor manufactured in CMOS technology in accordance with layout rules defined for a specific CMOS manufacturing process, comprising the steps of:

providing a photosensitive element;

providing a load transistor having a gate, the gate having a length which is at least 10% larger than gate lengths of transistors manufactured according to the layout rules imposed by the specific CMOS manufacturing process;

connecting the photosensitive element in series with the load transistor;

coupling a read circuit, comprising at least another transistor, to the photosensitive element and the load transistor, the read circuit configured to read out signals acquired in the photosensitive element and converted to a voltage drop across the load transistor.

* * * * *